United States Patent
Rocklein et al.

(10) Patent No.: US 7,863,198 B2
(45) Date of Patent: Jan. 4, 2011

(54) METHOD AND DEVICE TO VARY GROWTH RATE OF THIN FILMS OVER SEMICONDUCTOR STRUCTURES

(75) Inventors: M. Noel Rocklein, Boise, ID (US); F. Daniel Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 876 days.

(21) Appl. No.: 11/419,173

(22) Filed: May 18, 2006

(65) Prior Publication Data

US 2007/0269982 A1    Nov. 22, 2007

(51) Int. Cl.
*H01L 21/31* (2006.01)
*H01L 21/469* (2006.01)

(52) U.S. Cl. .................. 438/758; 438/430; 438/584; 438/680; 257/E21.17; 257/E21.171

(58) Field of Classification Search .............. 438/758, 438/507–509, 778–782; 257/E21.28, E21.274; 427/237, 248.1; 118/715
See application file for complete search history.

(56) References Cited

U.S. PATENT DOCUMENTS

| | | | |
|---|---|---|---|
| 6,093,638 A * | 7/2000 | Cho et al. ................ 438/627 |
| 2002/0160585 A1 * | 10/2002 | Park ......................... 438/507 |
| 2004/0203254 A1 * | 10/2004 | Conley et al. ............. 438/778 |
| 2004/0221807 A1 * | 11/2004 | Verghese et al. .......... 118/715 |
| 2005/0074983 A1 * | 4/2005 | Shinriki et al. ............ 438/785 |
| 2006/0022228 A1 * | 2/2006 | Hoshi et al. ................ 257/288 |
| 2006/0121689 A1 * | 6/2006 | Basceri et al. ............. 438/448 |

* cited by examiner

*Primary Examiner*—Charles D Garber
*Assistant Examiner*—Abdulfattah Mustapha
(74) *Attorney, Agent, or Firm*—Schwegman, Lundberg & Woessner, P.A.

(57) ABSTRACT

Methods and devices for controlling a growth rate of films in semiconductor structures are shown. Chemical vapor deposition methods and devices include the use of a reaction inhibitor that selectively varies a deposition rate along a surface. One specific method includes atomic layer deposition. One method shown provides high step coverage over features such as trenches in trench plate capacitors. Also shown are methods and devices to provide uniform batch reactor layer thicknesses. Also shown are methods for forming alloy layers with high control over composition. Also shown are methods to selectively control growth rate to provide growth only on selected surfaces.

30 Claims, 4 Drawing Sheets

METHOD AND DEVICE TO VARY GROWTH RATE OF THIN FILMS OVER SEMICONDUCTOR STRUCTURES

TECHNICAL FIELD

This application relates generally to semiconductor devices and device fabrication and, more particularly, to chemical vapor deposition of material layers in semiconductor fabrication.

BACKGROUND

In chemical vapor deposition techniques, reactions sometimes vary over a workpiece surface such as over a semiconductor wafer. For example, surface topography such as interconnect vias or trenches can exhibit different reaction rates at the top of the features compared to within the vias, trenches, etc. It is often desirable to reduce reaction rate variances to provide what is referred to as uniform step coverage. The desired result is a deposited material layer of uniform thickness over all surface topography. In other situations, it is desirable to selectively control or substantially eliminate reaction rates in one region, for example on a surface of a semiconductor wafer, in comparison to within a feature such as a trench or via, etc. It is also desirable to control reaction rates with more precision than existing techniques such as controlling flow rates of chemical vapor deposition components.

Atomic Layer Deposition (ALD) is one form of chemical vapor deposition (CVD) that is used with the desire to achieve conformal films. Some technical hurdles with ALD and CVD in general involve insufficient precursor flux at the bottom of trenches; precursor decomposition at the top of trenches; incomplete reactant gas separation leading to CVD at the top of the trench; or readsorption of reaction products leading to site blocking at the bottom of the trench. These mechanisms may also lead to non-uniformity in batch and traveling wave ALD or CVD reactions.

What is needed is an improved method of CVD and/or ALD that addresses these and other concerns.

DETAILED DESCRIPTION

Figure 1:
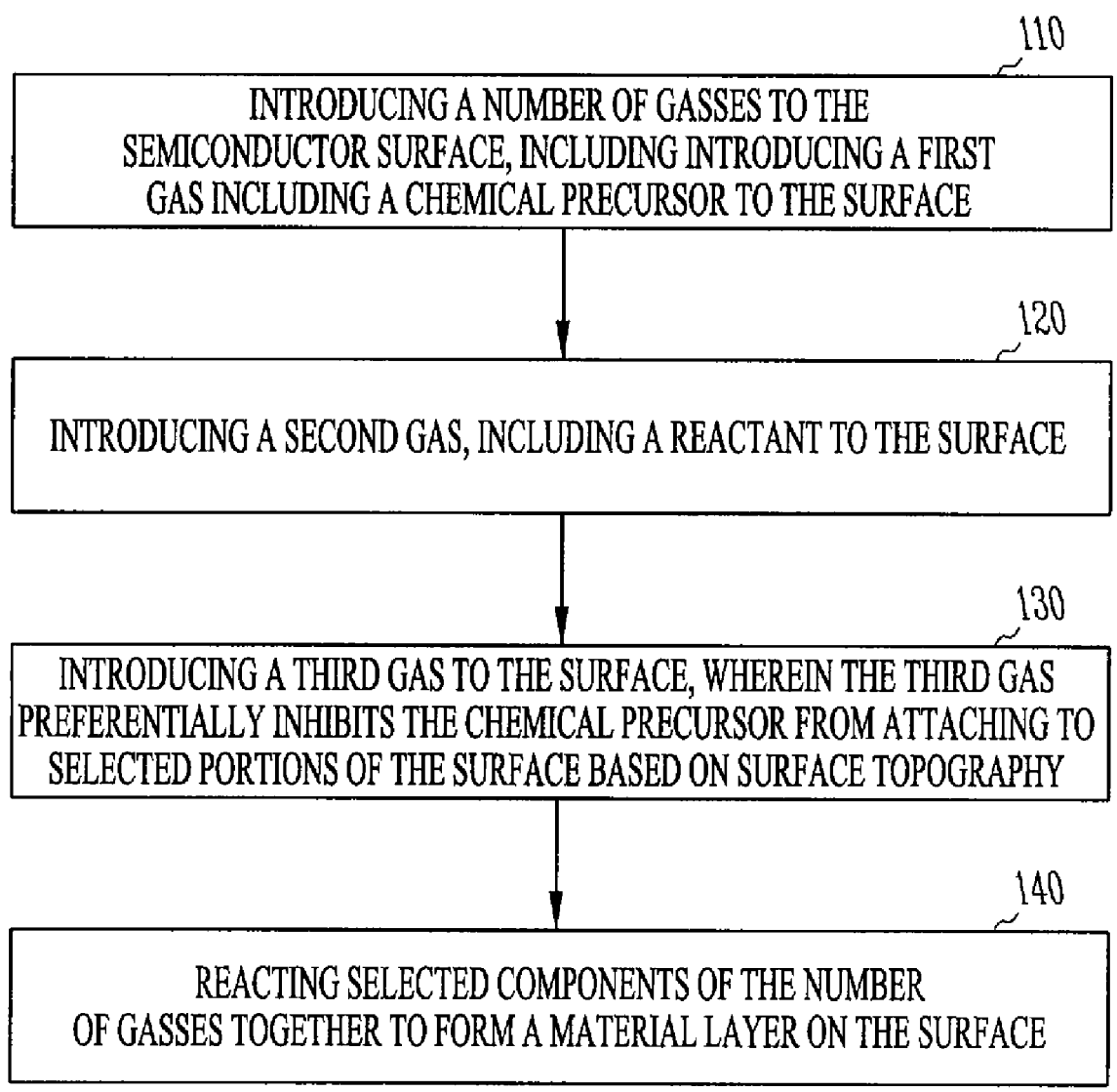
FIG. 1 shows one method of forming a material layer according to an embodiment of the invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors.

In the semiconductor device market, the drive reduce size of elements such as memory cells is ever present. One device element with engineering challenges as sizes continue to shrink is dielectric layers. Such layers are used in both volatile memories such as dynamic random access memories, and non-volatile memories such as flash, etc. As device sizes shrink, new materials and higher control over the deposition process must be used. For example, higher capacitance, lower leakage dielectric layers for capacitor dielectric and transistor gate applications are needed for scaling down device dimensions to realize a higher density memory. An approach to increasing the capacitance is to increase the dielectric constant of the capacitor dielectric. Some examples of higher dielectric constant materials include metal oxide dielectric films, such as $HfO_2$. In addition to choosing new materials to meet the challenges of reduced device sizes, the processes used to form the layers, and the resulting characteristics of layers of material must be closely controlled.

Candidates to replace $SiO_2$ include high-κ dielectric materials. High-κ materials include materials having a dielectric constant greater than silicon dioxide, for example, dielectric materials having a dielectric constant greater than about twice the dielectric constant of silicon dioxide. A set of high-κ dielectric candidates for replacing silicon oxide as the dielectric material in electronic components in integrated circuit includes lanthanide oxides, $HfO_2$, $ZrO_2$, $TiO_2$, other binary metal oxides, oxynitride materials, silicates, aluminates, etc.

Although dielectric layer deposition is discussed above, other material layers are also within the scope of the present disclosure. For example, conductor layers such as metals, metal nitrides, etc. can be deposited using methods and devices described below.

Material layers for use as gate dielectrics, capacitor plates, conducting vias, transistor contacts, etc. may be formed using a variety of chemical vapor deposition techniques. In one embodiment, a specific form of chemical vapor deposition known as atomic layer deposition (ALD) is used. In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber may be purged with a gas, where in many cases the purge gas is an inert gas. Between the pulses, the reaction chamber may be evacuated. Between the pulses, the reaction chamber may be purged with a gas and evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be performed in less than one second in properly designed flow type reaction chambers. Typically, precursor pulse times range from about 0.5 sec to about tens of seconds. In ALD, the saturation of all the reaction and purging phases makes the growth self-limiting.

The precursors used in an ALD process may be gaseous, liquid or solid. However, liquid or solid precursors should be volatile. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used though evaporation rates may vary somewhat during the process because of changes in their surface area.

The precursors should chemisorb on or react with the surface, though the interaction between the precursor and the surface as well as the mechanism for the adsorption is different for different precursors. The molecules at the substrate surface should react aggressively with the second precursor to form the desired solid film or film component. Using highly reactive precursors in ALD contrasts with the selection of precursors for conventional CVD. The by-products in the reaction should be gaseous in order to allow their easy removal from the reaction chamber.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

FIG. 1 shows a flow diagram of one improved method of material layer deposition using a chemical vapor deposition method such as one of the CVD varieties discussed above. In box 110, a chemical precursor gas is introduced to a surface of a semiconductor structure, such as a semiconductor wafer during processing. In one embodiment, the chemical precursor gas includes a metal containing chemical precursor. In one embodiment, the chemical precursor gas includes a metal halide precursor. In one embodiment, the chemical precursor gas includes a metal amide precursor. Metal precursors are useful in selected embodiments to form metal oxide dielectric materials, or metal conductor materials, or metal nitride materials, etc. Other precursor materials are also within the scope of the invention depending on the desired final material layer composition. Although a precursor gas is described, one of ordinary skill in the art, having the benefit of the present disclosure will recognize that precursor materials may also be solid or liquid as described above, although typically the precursor will be in a gas state at the stage in the process when it contacts the surface for deposition.

In box 120, a reactant gas is introduced to the surface. In one embodiment, the reactant gas includes an oxidizing reactant gas. In one embodiment the reactant gas includes water vapor. In one embodiment, the reactant gas includes ozone ($O_3$). In one embodiment the reactant gas includes a nitriding reactant. Other single reactants or multiple reactants are also within the scope of the invention, depending on the desired final material layer composition. As discussed under box 110, although the term gas is used to describe the reactant, the invention is not so limited, however, typically the reactant will be in a gas state at the stage in the process when it contacts the surface for deposition.

As described in box 130, the precursor is at least partially reacted with the reactant to form a material layer on the surface. Some examples of material layer compositions include hafnium oxide ($HfO_2$) titanium nitride (TiN), other oxides and nitrides, oxynitrides, metals, silicates, aluminates, etc. In one embodiment, the precursor gas and the reactant gas are introduced to the surface concurrently in a chemical vapor deposition process. In one embodiment, the precursor is introduced to the surface in a separate step, allowing the precursor to attach to the surface by chemisorption or other attachment mechanism. In one method, such as with an ALD embodiment, the surface is purged of precursor species between reaction steps. In one embodiment, a burst of inert gas such as argon is used to purge the surface between reaction steps. In one embodiment, precursor species are removed using a vacuum pump to purge the surface between reaction steps. In one embodiment a combination of inert gas and vacuum pump methods are used.

As described in box 140, in one embodiment, a reaction inhibitor is introduced to the surface at some point in a deposition process. In one embodiment, the reaction inhibitor is introduced prior to introduction of the precursor. In one embodiment, the reaction inhibitor includes a chemical to attach to the surface and block additional species such as the precursor from subsequently attaching. Such a mechanism is described as site poisoning. In regions of the surface where the reaction inhibitor poisons a site, there is reduced layer growth. Controlling a rate of layer growth is a useful tool as described below.

In surface embodiments with variations in surface topography, such as capacitor plate trenches, other trenches, vias, etc. a problem occurs when reaction species such as the precursor or the reactant do not penetrate all surface features at the same rate. As a result, selected regions such as top portions of the surface grow thicker than other topography such as the bottom of trenches, etc.

One advantage of embodiments using a reaction inhibitor as described above includes an ability to control layer reaction rates over the surface to counteract the preferential growth on surfaces such as top portions as described above. In one embodiment, the reaction inhibitor preferentially site poisons the very surfaces that would normally grow too thick without the use of a reaction inhibitor. Similar to the mechanism that causes the top of trenches to grow too thick, in one embodiment, the reaction inhibitor site poisons the top surfaces more easily, and the site poisoning effect diminishes with topography such as in the bases of trenches. Using a trench as an example, the top surface growth rate is slowed as a result of the reaction inhibitor, while growth rate in the bottoms of trenches remains substantially unchecked. In one embodiment, this effect is used to form a material layer with high step coverage, or with minimal variation in layer thickness regardless of surface topography.

One example of a reaction inhibitor includes HCl. Using a hafnium oxide material layer growth as an ALD example, one common precursor includes hafnium tetrachloride ($HfCl_4$). Other hafnium precursors such as hafnium amido complexes are also within the scope of the invention. The reaction inhibitor HCl is introduced in a controlled amount to site poison regions of the surface or $HfO_2$ surface preferentially as described above. $HfCl_4$ is then introduced and reacts readily with the surface or hafnium surface that experienced low or no exposure to HCl gas. Conversely, $HfCl_4$ does not react readily with the surface or hafnium surface that experienced some or high exposure to HCl gas.

Although hafnium oxide material layer growth is used as an example, the invention is not so limited. For example, zirconium oxide material layer growth is accomplished using appropriate precursors such as $ZrCl_4$, zirconium amido complexes, etc. Other metal halides or metal amido complexes etc. are within the scope of the invention. Selection of a precursor depends on the chemistry of the desired layer.

A reactant such as water vapor, or ozone is next introduced to react with both the adsorbed $HfCl_4$ precursor and the adsorbed reaction inhibitor HCl. Where the $HfCl_4$ is present, $HfO_2$ is left behind, and a chlorine containing gas species is released. The chlorine gas species is later purged from the system. Where the reaction inhibitor is present, a chlorine containing gas species is also released and the reactivity of the $HfO_2$ surface is regenerated. Because substantially all of the reaction inhibitor reaction products are removed, and no $HfO_2$ is grown in poisoned sites, the growth rate of the material layer is reduced preferentially where higher surface concentrations of reaction inhibitor are present.

Although HCl is described as a reaction inhibitor using the ALD example described above, the invention is not so limited. Other reaction inhibitors include but are not limited to $CO_2$, CO, HCN, $XeF_6$, HBr, and HI. One of ordinary skill in the art having the benefit of the present disclosure will recognize that selection of an appropriate reaction inhibitor depends on the particular chemical reaction to be inhibited.

Similar to increasing layer thickness uniformity, in one embodiment, batch processor uniformity is increased using a reaction inhibitor as described above. Some regions of a large, multiple wafer reactor may be more preferential to flow and attachment of precursors or reactants, etc. By using a reaction inhibitor as described above, a growth rate is slowed down in regions with normally excessive growth rate, while the growth rate in less accessible regions of the reactor are substantially unchanged or reduced to a significantly lesser extent. The result is a batch reactor process with less thickness variation from one wafer to the next.

A method of forming a layer with minimal thickness variation is described above, however the invention is not so limited. In one embodiment, a reaction inhibitor is used to preferentially create thickness variations in desired locations. For example, in one embodiment material layer growth on a top surface is substantially eliminated, and a resulting material layer is only grown within a trench. One possible device application would be a trench capacitor plate. By only growing a material layer within a trench, other processing operations such as chemical mechanical polishing (CMP) to remove unwanted surface material are eliminated.

In many CVD or ALD processes, multiple layers are deposited in sequence to form a laminate stack of several layers. One technique of forming a compound material of a specified composition includes varying the number of layers of each lamina in the stack. In one embodiment, the resulting laminate is subsequently heated to diffuse the layers together and form one larger layer of a desired composition. One example of such a method includes forming a metal alloy layer by alternating and varying a number of metal layers to form the desired alloy composition.

In one embodiment, a reaction inhibitor as described above is further used to adjust at least one layer thickness of individual lamina in a laminate stack. By tightly controlling thicknesses of individual layers, the final diffused layer composition is more tightly controlled than would be available by just controlling flow rates of reactants without the use of a reaction inhibitor. In one embodiment, the laminate layers are thick enough to be considered discrete layers with multiple interfaces. In this embodiment, a reaction inhibitor can be used to improve thickness uniformity to create parallel interfaces, or can be used to degrade thickness uniformity to create non-parallel interfaces.

Figure 2:
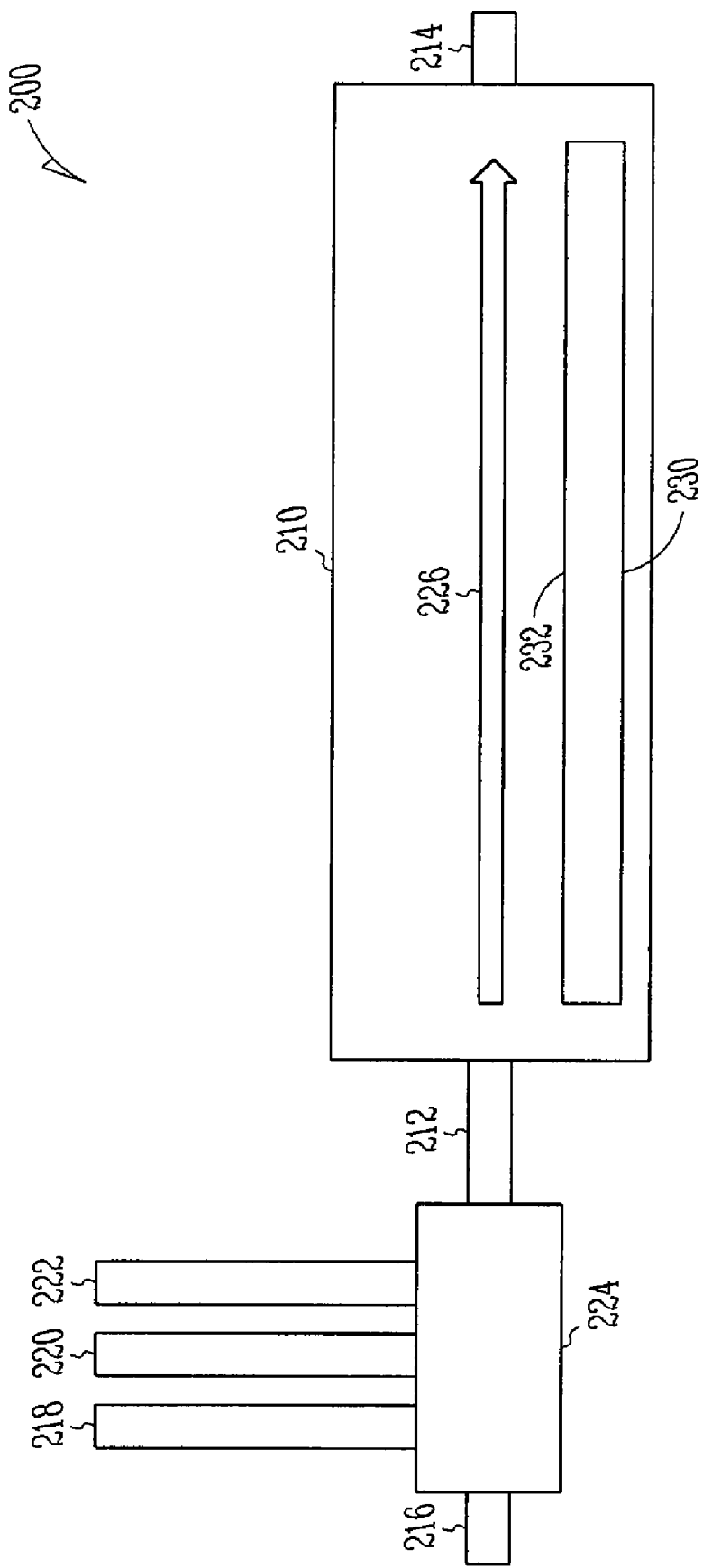
FIG. 2 shows a block diagram of a deposition system according to an embodiment of the invention.

FIG. 2 shows a reaction system 200 according to an embodiment of the invention. In one embodiment, the reaction system 200 includes a conventional CVD system. In one embodiment, the reaction system 200 includes a specialized CVD system such as an ALD system. A reaction chamber 210 is shown with a substrate 230 inside the reaction chamber. The wafer includes a surface 232 where a material layer growth is desired.

A gas inlet port 212 and a gas outlet port 214 are coupled to the reaction chamber 210 of the system 200. A first component connection 218, a second component connection 220, and a third component connection 222 are shown coupled to the inlet port 212. In one embodiment, flow controls 224 are located between the component connections and the inlet port 212. Operation of the flow controls selectively opens one or more of the component connections, allowing a chemical component such as a precursor, reactant, reaction inhibitor, etc. into the reaction chamber through the inlet port 212.

In one embodiment, a purging system 216 is further included in the reaction system 200. In one embodiment, the purging system 216 includes a supply of inert gas such as argon. In one embodiment, the purging system 216 includes other purging gases. In one embodiment, the purging system 216 include an evacuation system such as a vacuum pump. In one embodiment, the flow controls 224 shown in block diagram format, control operation of the purging system 216 in addition to controlling the component connections 218-222. In one embodiment, such as an evacuation system embodiment, the purging system 216 is coupled to the outlet port 214 instead of the inlet port 212. One of ordinary skill in the art, having the benefit of the present disclosure will recognize that several different reaction system configurations are possible in addition to the example illustration shown in FIG. 2. FIG. 2 is therefore not to be taken as limiting, and other reasonable configurations are within the scope of the present invention.

In one example method, a metal precursor source is coupled to the first component connection 218. A reactant source is coupled to the second component connection 220, and a reaction inhibitor is coupled to the third component connection 222. Using the hafnium oxide deposition example described above, the flow controls 224 are actuated to first introduce HCl as a reaction inhibitor to the reaction surface 232. The amount of HCl introduced controls the amount of site poisoning. A hafnium precursor such as $HfCl_4$ is then introduced using the flow controls 224. As described above, the $HfCl_4$ does not attach to the surface 232 as readily where the HCl has provided site poisoning. A reactant gas such as water vapor is then introduced to the surface 232 using the flow controls 224 to oxidize the adsorbed hafnium precursor and form a layer of $HfO_2$ while also removing chlorine species from the poisoned sites to reactivate the $HfO_2$ surface in its entirety. As discussed above, by using HCl as a reaction inhibitor in the process, the $HfO_2$ layer thickness is controlled. In addition, in one embodiment, use of a reaction inhibitor reduces unwanted buildup of material on the walls of the reaction chamber 210.

Figure 3:
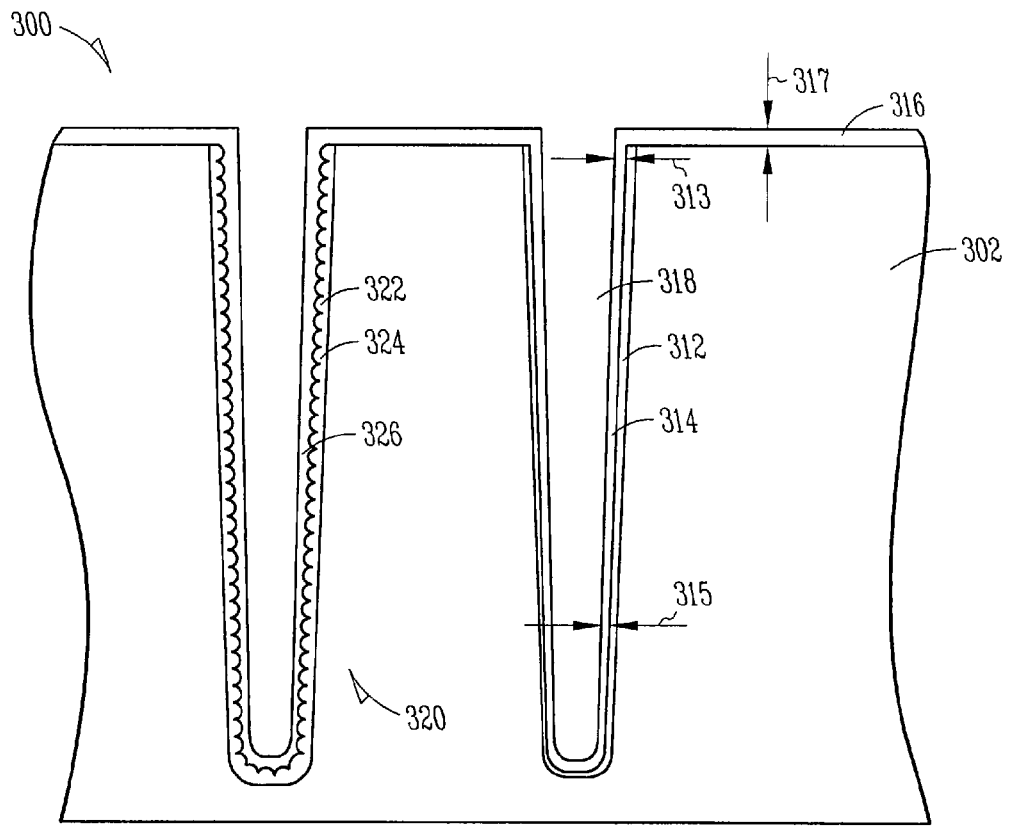
FIG. 3 shows examples of portions of capacitors according to an embodiment of the invention.

FIG. 3 shows two examples of trench capacitors formed in a substrate 300 using methods described above. A first capacitor 310 is shown with a first plate 312 formed from a conducting layer deposited within a trench. A dielectric layer 314 is shown formed over the first plate 312, and a second plate 318 is formed by filling the remaining trench with a conductor material. In one embodiment, it is desirable to maintain a consistent layer thickness when depositing layers such as the dielectric layer 314. As described above, in prior methods, the surface topography of the trench often caused undesirable differences in thickness, such as region 315 being thin, region 313 being thicker, and region 317 being the thickest due to growth rate differences.

Using methods as described above, such as use of reaction inhibitors in CVD processes, thicknesses at regions 315, 313, and 317 can be controlled. In one embodiment, the thickness at regions 315, 313, and 317 is substantially the same after a CVD deposition process without any additional processing. In one embodiment, the thickness 317 is substantially reduced, or eliminated while layer growth within the trench at regions 313 and 315 are substantially the same.

The second capacitor 320 shown in FIG. 3 illustrates a further example of challenging surface topography that benefits from deposition methods as described above. A first plate 322 is formed from a conductor material. In the example shown, the first plate 322 includes a hemispherical grain (HSG) structure with a number of bumps 324 to increase a surface area of the first plate 322. Using methods as described above, such as use of reaction inhibitors in CVD processes, a more uniform dielectric layer 326 is formed over the first plate 322. Even though the surface of the first plate 322 includes an uneven topography, the methods shown using reaction inhibitors provide controllable growth over the first plate surface.

Figure 4:
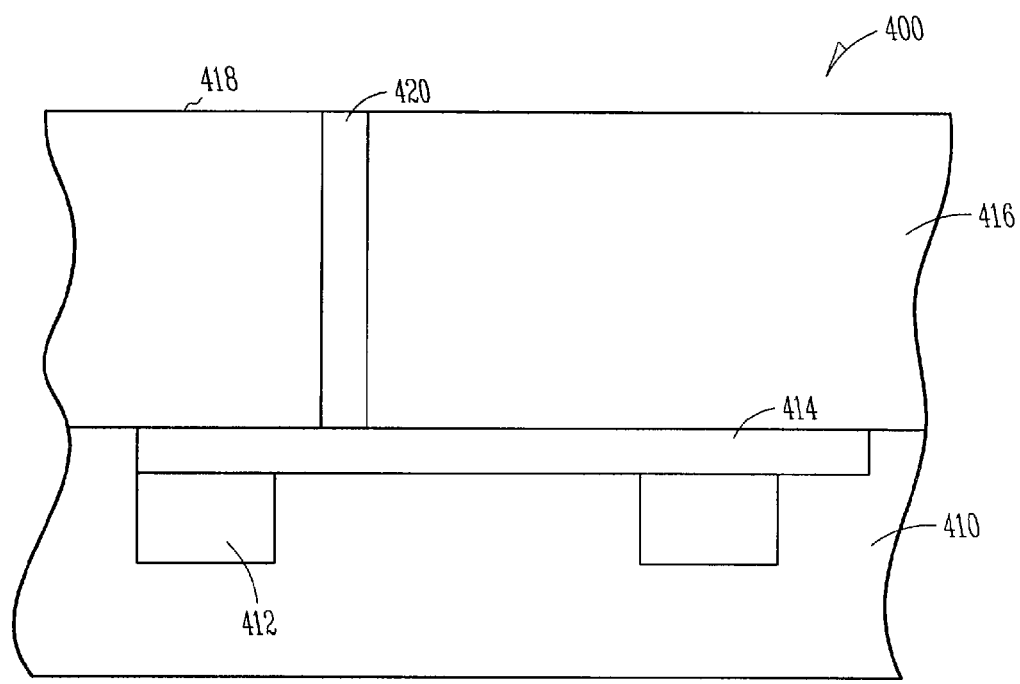
FIG. 4 shows a portion of a semiconductor device according to an embodiment of the invention.

Although dielectric layer device examples are shown in FIG. 3, the invention is not so limited. Another device example is illustrated in FIG. 4. A portion of a device 400 is shown formed on a substrate 410. A number of individual electronic devices 412 such as transistors are shown with interconnecting circuitry 414. An insulator layer 416 is shown over the individual electronic devices 412 and the circuitry 414. A via 420 is shown to electrically couple a surface 418 of the dielectric layer 416 to the individual electronic devices 412 located below. In one embodiment, the via 420 is deposited from conductive material such as metal using CVD or ALD methods as described above. In one embodiment, layer growth on the surface 418 is substantially reduced or eliminated using reaction inhibitors as described above, while growth of conductor material within the via 420 remains unchanged. One benefit of this method includes the elimination of a post deposition etching or chemical mechanical polishing step to remove unwanted material from the surface 418. Although a via is shown, other semiconductor components such as contacts, etc. can also be formed using these methods.

Transistors, capacitors, and other devices formed by the methods described above may be implemented into memory devices and electronic systems including information handling devices. Embodiments of these information handling devices may include telecommunication systems, wireless systems, and computers. Further, embodiments of electronic devices may be realized as integrated circuits.

Figure 5:
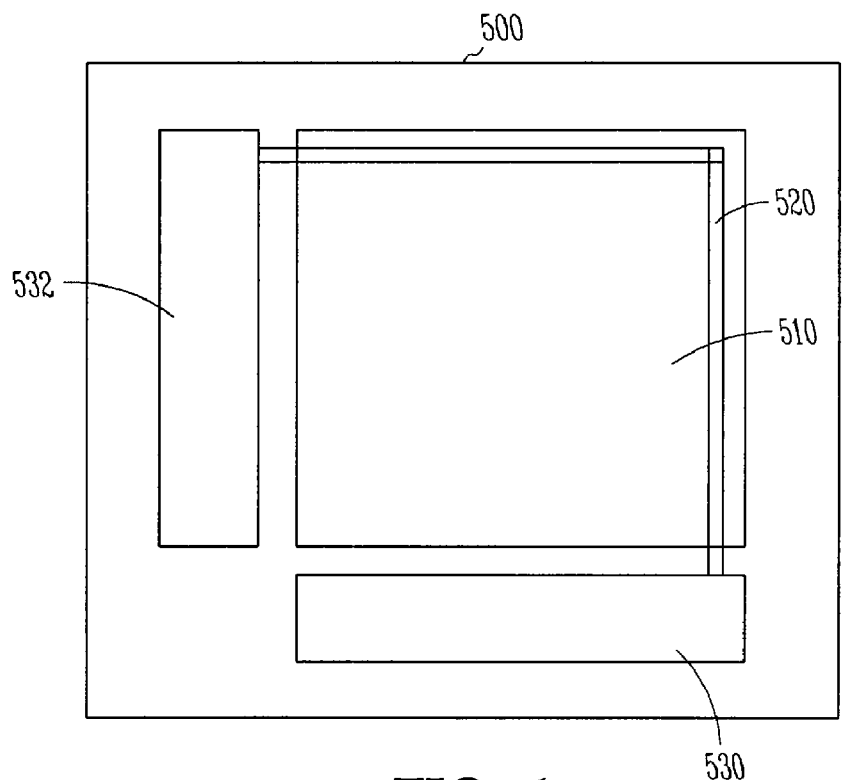
FIG. 5 shows a block diagram of a semiconductor memory according to an embodiment of the invention.

FIG. 5 illustrates an example of a semiconductor memory 500 formed using methods described above. The memory 500 includes an array of memory cells 510 such as dynamic random access memory (DRAM) cells, or flash memory cells. A first sense amplifier 530 is included in one embodiment. A second sense amplifier 532 is included in one embodiment. Circuitry 520 is coupled between cells in the array 510 and one or more sense amplifiers to detect the state of selected cells.

Figure 6:
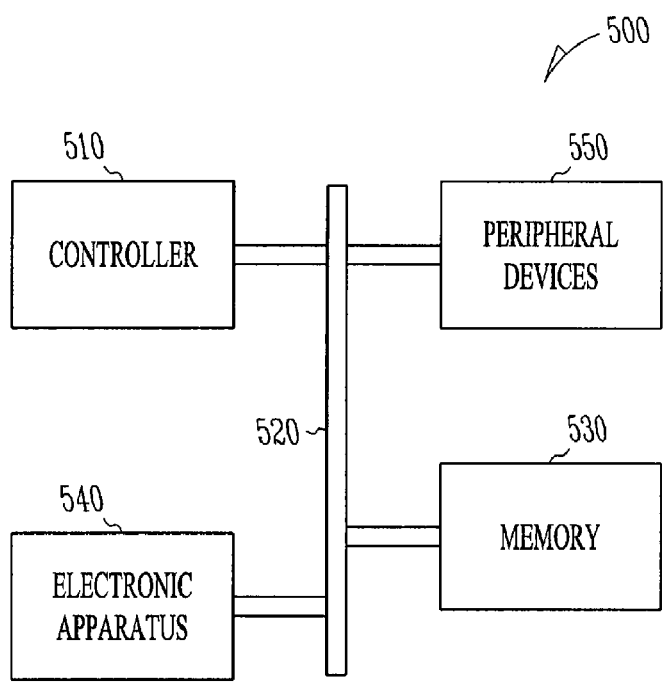
FIG. 6 shows a block diagram of an electronic system according to an embodiment of the invention.

FIG. 6 depicts a diagram of an embodiment of a system 500 having a controller 510 and a memory 530. The controller 510 or memory 530 may include an embodiment of deposited material layer in accordance with the teachings herein. System 500 also includes an electronic apparatus 540 and a bus 520, where bus 520 provides electrical conductivity between controller 510 and electronic apparatus 540, and between controller 510 and memory 530. Bus 520 may include an address, a data bus, and a control bus, each independently configured. Alternatively, bus 520 may use common conductive lines for providing address, data, or control, the use of which is regulated by controller 510. In one embodiment, electronic apparatus 540 may be additional memory configured similar as memory 530. An embodiment may include an additional peripheral device or devices 550 coupled to bus 520. In one embodiment, the controller 510 is a processor. In one embodiment, the controller 510 is a processor having a memory. Any of controller 510, memory 530, bus 520, electronic apparatus 540, and peripheral device devices 550 may include a deposited material layer as described in selected embodiments above. System 500 may include, but is not limited to, information handling devices, telecommunication systems, and computers.

Peripheral devices 550 may include displays, additional storage memory, or other control devices that may operate in conjunction with controller 510. Alternatively, peripheral devices 550 may include displays, additional storage memory, or other control devices that may operate in conjunction with the controller 510 or memory 530, etc.

Memory 530 may be realized as a memory device containing a deposited material layer in accordance with various embodiments. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method of depositing material on a semiconductor surface, comprising:
   introducing a number of gasses to the semiconductor surface, including:
      introducing a first gas including a chemical precursor to the surface;
      introducing a second gas, including a reactant to the surface;
      introducing a third gas to the surface, wherein the third gas preferentially inhibits the chemical precursor from attaching to selected portions of the surface based on surface topography; and
   reacting selected components of the number of gasses together to form a material layer on the surface.

2. The method of claim 1, wherein introducing a first gas including a chemical precursor includes introducing a metal halide precursor.

3. The method of claim 1, wherein introducing a first gas including a chemical precursor includes introducing a metal amide precursor.

4. The method of claim 1, wherein introducing a second gas includes introducing an oxidizing reactant.

5. The method of claim 4, wherein introducing a second gas includes introducing water vapor.

6. The method of claim 4, wherein introducing a second gas includes introducing ozone.

7. The method of claim 1, wherein introducing a second gas includes introducing a nitriding reactant.

8. The method of claim 1, wherein introducing the third gas includes adsorbing the third gas at selected sites on the surface.

9. The method of claim 1, wherein introducing the third gas includes introducing HCl.

10. A method of depositing material on a semiconductor surface, comprising:
    sequentially introducing a number of gasses to the semiconductor surface, including:
       introducing a first gas to the surface in a reaction chamber, wherein the first gas preferentially attaches to selected portions of the surface based on surface topography;
       introducing a second gas including a chemical precursor to the surface, wherein the second gas in inhibited from attaching to portions of the surface where the first gas has attached;
       introducing a third gas, including a reactant to the surface;
       purging the reaction chamber between each gas;
    reacting selected components of the number of gasses together to form a material layer on the surface.

11. The method of claim 10, wherein purging the reaction chamber includes introducing an inert gas to remove previous gas from the reaction chamber.

12. The method of claim 10, wherein purging the reaction chamber includes evacuating substantially all of the gas from the reaction chamber.

13. The method of claim 10, wherein introducing the first gas includes introducing HCl gas.

14. The method of claim 10, wherein introducing the second gas includes introducing $HfCl_4$ gas.

15. The method of claim 10, wherein introducing the second gas includes introducing $ZrCl_4$ gas.

16. The method of claim 10, wherein introducing the third gas includes introducing ozone.

17. A method of forming a film, comprising:
    forming multiple layers of material on a surface, including;
       forming a first layer;
       forming a second layer having a different chemical composition than the first layer;
    wherein forming at least one layer of the multiple layers includes:
       introducing a first gas including a chemical precursor to the surface;
       introducing a second gas, including a reactant to the surface;
       introducing an amount of a third gas to the surface, wherein the third gas partially inhibits the chemical precursor from attaching to the surface; and
       reacting selected components of the number of gasses together to foam a material layer on the surface.

18. The method of claim 17, further including mixing the multiple layers to form a single film having a substantially homogenous chemical profile.

19. The method of claim 17, wherein mixing the multiple layers includes mixing multiple metal layers to form a metal alloy.

20. A method of forming a semiconductor memory, comprising:
    forming a number of memory cells;
    coupling programming and reading circuitry to the number of memory cells;
    coupling at least one sense amplifier to the number of memory cells;
    wherein forming at least one component of the number of memory cells includes forming a material layer, including:
       introducing a number of gasses to the semiconductor surface, including:
          introducing a first gas including a chemical precursor to the surface;
          introducing a second gas, including a reactant to the surface;
          introducing a third gas to the surface, wherein the third gas preferentially inhibits the chemical precursor from attaching to selected portions of the surface based on surface topography; and
       reacting selected components of the number of gasses together to form a material layer on the surface.

21. The method of claim 20, wherein forming at least one component of the number of memory cells includes forming a storage capacitor plate.

22. The method of claim 20, wherein forming at least one component of the number of memory cells includes forming a storage capacitor dielectric layer.

23. The method of claim 20, wherein forming at least one component of the number of memory cells includes forming a gate dielectric layer.

24. The method of claim 20, wherein forming at least one component of the number of memory cells includes forming a gate metal layer.

25. The method of claim 20, wherein forming at least one component of the number of memory cells includes forming a transistor source/drain contact.

26. The method of claim 20, wherein forming at least one component of the number of memory cells includes forming a conducting via.

27. A method of forming an electronic system, comprising:
    forming a semiconductor memory;
    coupling a controller to the memory through a bus;
    wherein forming a semiconductor memory includes forming a material layer in at least one component, including:
       introducing a number of gasses to the semiconductor surface, including:

introducing a first gas including a chemical precursor to the surface;

introducing a second gas, including a reactant to the surface;

introducing a third gas to the surface, wherein the third gas preferentially inhibits the chemical precursor from attaching to selected portions of the surface based on surface topography; and reacting selected components of the number of gasses together to form a material layer on the surface.

28. The method of claim 27, wherein forming the semiconductor memory includes forming a dynamic random access memory.

29. The method of claim 27, wherein forming the semiconductor memory includes forming a flash memory.

30. The method of claim 27, wherein coupling the controller to the memory includes coupling a processor to the memory.

* * * * *

UNITED STATES PATENT AND TRADEMARK OFFICE
CERTIFICATE OF CORRECTION

| | | |
|---|---|---|
| PATENT NO. | : 7,863,198 B2 | Page 1 of 1 |
| APPLICATION NO. | : 11/419173 | |
| DATED | : January 4, 2011 | |
| INVENTOR(S) | : M. Noel Rocklein et al. | |

It is certified that error appears in the above-identified patent and that said Letters Patent is hereby corrected as shown below:

In column 10, line 14, in Claim 17, delete "foam" and insert -- form --, therefor.

Signed and Sealed this
Eighth Day of March, 2011

David J. Kappos
*Director of the United States Patent and Trademark Office*